(12) United States Patent
Jian

(10) Patent No.: US 12,464,676 B2
(45) Date of Patent: Nov. 4, 2025

(54) ELECTRONIC EQUIPMENT WITH IMMERSION COOLING SYSTEM

(71) Applicant: SUNONWEALTH ELECTRIC MACHINE INDUSTRY CO., LTD., Kaohsiung (TW)

(72) Inventor: Wei-Qian Jian, Kaohsiung (TW)

(73) Assignee: SUNONWEALTH ELECTRIC MACHINE INDUSTRY CO., LTD., Kaohsiung (TW)

(*) Notice: Subject to any disclaimer, the term of this patent is extended or adjusted under 35 U.S.C. 154(b) by 275 days.

(21) Appl. No.: 18/326,412

(22) Filed: May 31, 2023

(65) Prior Publication Data
US 2024/0015928 A1    Jan. 11, 2024

(30) Foreign Application Priority Data
Jul. 7, 2022  (TW) .................................. 111207259

(51) Int. Cl.
*H05K 7/20* (2006.01)

(52) U.S. Cl.
CPC ..... *H05K 7/20272* (2013.01); *H05K 7/20236* (2013.01)

(58) Field of Classification Search
CPC .......... H05K 7/20272; H05K 7/20236; H05K 7/20763; H05K 7/20772; F28F 13/12
See application file for complete search history.

(56) References Cited

U.S. PATENT DOCUMENTS

| | | | |
|---|---|---|---|
| 10,015,905 B2* | 7/2018 | Watanabe | H01L 23/473 |
| 10,881,020 B1 | 12/2020 | Liu et al. | |
| 2020/0315055 A1* | 10/2020 | Tian | H05K 7/20809 |
| 2023/0025254 A1* | 1/2023 | Curtis | H05K 7/20254 |
| 2023/0026424 A1* | 1/2023 | Curtis | H05K 7/20172 |
| 2023/0232582 A1* | 7/2023 | Liu | H05K 7/20809 |
| | | | 361/679.53 |

(Continued)

FOREIGN PATENT DOCUMENTS

| | | | | |
|---|---|---|---|---|
| CN | 111692897 A | * | 9/2020 | |
| CN | 114158242 A | * | 3/2022 | |
| CN | 114679901 A | * | 6/2022 | H05K 7/2029 |

(Continued)

OTHER PUBLICATIONS

CN-111692897-A Translation (Year: 2020).*

(Continued)

*Primary Examiner* — Jayprakash N Gandhi
*Assistant Examiner* — Matthew Sinclair Muir
(74) *Attorney, Agent, or Firm* — WPAT, PC

(57) ABSTRACT

An electronic equipment with an immersion cooling system includes a sealed tank filled with an electrically non-conductive liquid which is a single-phase electrically non-conductive liquid; a plurality of slots disposed in the sealed tank; at least one electric unit removably inserted in the plurality of slots and including at least one heat source; and an air supply unit disposed in the sealed tank. The air supply unit includes a ventilation tube unit and a plurality of air diffuser. The plurality of air diffusers is coupled with the ventilation tube unit, is immersed in the electrically non-conductive liquid, and is configured to generate bubbles for stirring the electrically non-conductive liquid.

18 Claims, 9 Drawing Sheets

(56) References Cited

U.S. PATENT DOCUMENTS

2024/0224476 A1* 7/2024 Kajitani ............... G06F 1/20

FOREIGN PATENT DOCUMENTS

| TW | I710883 B | 11/2020 |
| TW | I750733 B | 12/2021 |
| WO | WO-2020100816 A1 * | 5/2020 |

OTHER PUBLICATIONS

CN-114158242-A Translation (Year: 2022).*
CN-114679901-A Translation (Year: 2022).*
WO-2020100816-A1 Translation (Year: 2020).*

* cited by examiner

ELECTRONIC EQUIPMENT WITH IMMERSION COOLING SYSTEM

CROSS REFERENCE TO RELATED APPLICATION

The application claims the benefit of Taiwan application serial No. 111207259, filed on Jul. 7, 2022, and the entire contents of which are incorporated herein by reference.

BACKGROUND OF THE INVENTION

1. Field of the Invention

The present invention relates to a cooling technology for an electronic equipment and, more particularly, to an electronic equipment with an immersion cooling system in which an electric module is immersed in an electrically non-conductive liquid in order to be maintained at a proper working temperature.

2. Description of the Related Art

A conventional electronic equipment with an immersion cooling system generally includes an equipment body and a positioning shelf. A cooling liquid is filled in an interior of the equipment body. The positioning shelf is located in a sealed tank and includes a plurality of slots. The electronic equipment with an immersion cooling system may include a plurality of electric units coupled in the plurality of slots, such that the heat sources of the plurality of electric units can be immersed in the cooling liquid. Therefore, the heat energy of the high temperature generated by the plurality of electric units during working can be directly absorbed by the cooling liquid to maintain the plurality of electric units at a proper working temperature, thereby achieving the expected working efficiency and service life.

However, in the above conventional electronic equipment with an immersion cooling system, the cooling liquid in the equipment body encounters a problem of uneven heat distribution. Namely, the temperature of the cooling liquid surrounding the heat sources is higher and, thus, difficult to absorb heat energy for conducting heat transfer. Therefore, the cooling effect of the cooling liquid on the heat source is limited. As a result, the cooling liquid cannot effectively cool the heat source, leading to unsatisfactory cooling efficiency.

In light of this, it is necessary to improve the conventional electronic equipment with an immersion cooling system.

SUMMARY OF THE INVENTION

It is therefore an objective of the present invention to provide an electronic equipment with an immersion cooling system which permits rapid dispersion of the electrically non-conductive liquid of a relatively lower temperature, such that the heat distribution of the electrically non-conductive liquid is more uniform.

It is another objective of the present invention to provide an electronic equipment with an immersion cooling system which can provide a better cooling effect.

It is yet another objective of the present invention to provide an electronic equipment with an immersion cooling system which can increase the air supply efficiency.

It is a further objective of the present invention to provide an electronic equipment with an immersion cooling system which can reduce the manufacturing costs.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

As used herein, the term "engagement", "coupling", "assembly", or similar terms is used to include separation of connected members without destroying the members after connection or inseparable connection of the members after connection. A person having ordinary skill in the art would be able to select according to desired demands in the material or assembly of the members to be connected.

As used herein, the term "single-phase electrically non-conductive liquid" refers to an electrically non-conductive liquid which does not change between different phases when cooling a heat source. Namely, the electrically non-conductive liquid maintains in the liquid phase and cools the heat source without undergoing liquid-gas and gas-liquid phase changes.

An electronic equipment with an immersion cooling system according to the present invention includes a sealed tank filled with an electrically non-conductive liquid which is a single-phase electrically non-conductive liquid; a plurality of slots disposed in the sealed tank; at least one electric unit removably inserted in the plurality of slots and including at least one heat source; and an air supply unit disposed in the sealed tank. The air supply unit includes a ventilation tube unit and a plurality of air diffuser. The plurality of air diffusers is coupled with the ventilation tube unit, is immersed in the electrically non-conductive liquid, and is configured to generate bubbles for stirring the electrically non-conductive liquid.

Therefore, in the electronic equipment with an immersion cooling system according to the present invention, the air supply unit is disposed in the sealed tank, and the air supplied by the air supply unit can form upwardly flowing bubbles which disperse in the electrically non-conductive liquid. The upwardly flowing bubbles can cause flow and rapid dispersion of the electrically non-conductive liquid at a relatively lower temperature to thereby flow through the heat source of the electric module of the electric unit. Therefore, the heat distribution of the electrically non-conductive liquid is more uniform, such that the electrically non-conductive liquid can effectively cool the heat source. Accordingly, a good cooling efficiency can be achieved.

In an example, the ventilation tube unit may include a main tube and a plurality of branch tubes. The plurality of branch tubes may intercommunicate with the main tube and may be aligned with the plurality of slots. Thus, the air can flow through the main tube into the plurality of branch tubes, increasing the air supply efficiency.

In an example, the ventilation tube unit may include a plurality of air inlet tubes. The plurality of air inlet tubes may intercommunicate with the main tube and may be aligned with the plurality of slots. The plurality of air diffusers may be coupled with the plurality of air inlet tubes. Thus, it can be assured that the air can flow into each of the plurality of slots to cool the heat source, thereby providing a better cooling effect.

In an example, each of the plurality of air diffusers may include a diffuser body and a plurality of through holes. The diffuser body may intercommunicate with the plurality of air inlet tubes. The plurality of through holes may extend through the diffuser body. Thus, the structure is simple and easy to manufacture, thereby reducing the manufacturing costs.

In an example, the sealed tank may include a tank body. The electrically non-conductive liquid may be received in the tank body. An opening may be formed on a top end of the tank body. The sealed tank may include a base and a lid. The base may be coupled to a bottom of the tank body. The lid may be coupled to the tank body and covers the opening. Thus, the structure is simple and easy to assemble.

In an example, the sealed tank may include an air inlet and an air outlet. The air inlet may be disposed on the base. The air outlet may be disposed on the lid. Therefore, the structure can be simple and easy to assemble.

In an example, the electronic equipment with the immersion cooling system according to the present invention may further include an air pump disposed outside the sealed tank and intercommunicating with the air inlet. Thus, the air pump can be easily replaced or maintained.

In an example, the electronic equipment with the immersion cooling system according to the present invention may further include an air pump disposed inside the sealed tank. The tank body may include a channel having an end intercommunicating with the air pump and another end intercommunicating with a main tube of the air supply unit. Thus, interference from other elements can be easily avoided while installing the electronic equipment with an immersion cooling system, providing installation convenience.

In an example, the electric unit may include at least one fluid driving member which may be disposed below the at least one heat source. Thus, the fluid driving member can drive the electrically non-conductive liquid at a relatively lower temperature and the bubbles to flow through the heat source, providing a better cooling efficiency.

In an example, the at least one fluid driving member may be located between the at least one heat source and an air diffuser of the air supply unit. Thus, it can be assured that the bubbles formed by each air diffuser can firstly flow through the fluid driving member and then flow towards the heat source, such that the bubbles can disperse more easily in the electrically non-conductive liquid.

In an example, the electric unit may include a casing removably inserted in one of the plurality of slots. The electric unit may include an electric module which is disposed in the casing and which includes the at least one heat source. Thus, the casing permits easy installation of the electric module and easy insertion into the respective slot, providing easy assembly and easy operation.

In an example, the electric unit may include a substrate. The at least one heat source may be disposed on the substrate. The electric unit may include a fluid driving member disposed in the casing or on the substrate. Thus, the fluid driving member can be installed according to the user's need, providing easy installation.

In an example, the electric unit may include a fluid passage hood coupled to the casing or the substrate. The casing may include a bottom end being open. The at least one heat source may be located inside the fluid passage hood. Thus, the fluid passage hood restricts the flow area of the electrically non-conductive liquid and the bubbles, such that the electrically non-conductive liquid and the bubbles can be driven by the fluid driving member to more concentratively flow through the heat source, providing a better cooling efficiency.

In an example, the electric unit may include at least one auxiliary cooling member in thermal connection with the at least one heat source and located inside the fluid passage hood. Thus, a better cooling efficiency can be provided.

In an example, a fluid passage may be formed in the fluid passage hood, and a discharge direction of the fluid driving member may face a lid of the sealed tank. Thus, a smoother flow guiding effect can be provided.

In an example, two ends of the fluid passage hood may be open to form a top opening and a bottom opening. A discharge port of the fluid driving member may be adjacent to the bottom opening. Thus, the electrically non-conductive liquid and the bubbles flowing out of the discharge port can be directly guided into the fluid passage and flow through the heat source, providing better cooling efficiency.

In an example, the top end of the casing may include a hook. Thus, a user can hold the hook and apply a force to remove the casing out of the associated slot, providing easy use and operation.

In an example, the electronic equipment with the immersion cooling system according to the present invention may further include a pipe unit. An end of the pipe unit may be connected to a liquid inlet of the sealed tank. Another end of the pipe unit may be connected to a liquid outlet of the sealed tank. A liquid pump and a cooling unit may be serially connected between the end and the another end of the pipe unit. Thus, the electrically non-conductive liquid can be rapidly cooled through the external circulation, increasing the cooling efficiency.

In an example, the electronic equipment with the immersion cooling system according to the present invention may further include a pipe unit. An end of the pipe unit may be connected to a liquid inlet of the sealed tank. Another end of the pipe unit may be connected to a liquid outlet of the sealed tank. A cooling distribution unit may be serially connected between the end and the another end of the pipe unit. Thus, the electrically non-conductive liquid can be rapidly cooled through the external circulation, increasing the cooling efficiency.

In an example, the plurality of air diffusers may include bubble stones. Thus, the air diffusers can generate bubbles efficiently for stirring the electrically non-conductive liquid.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
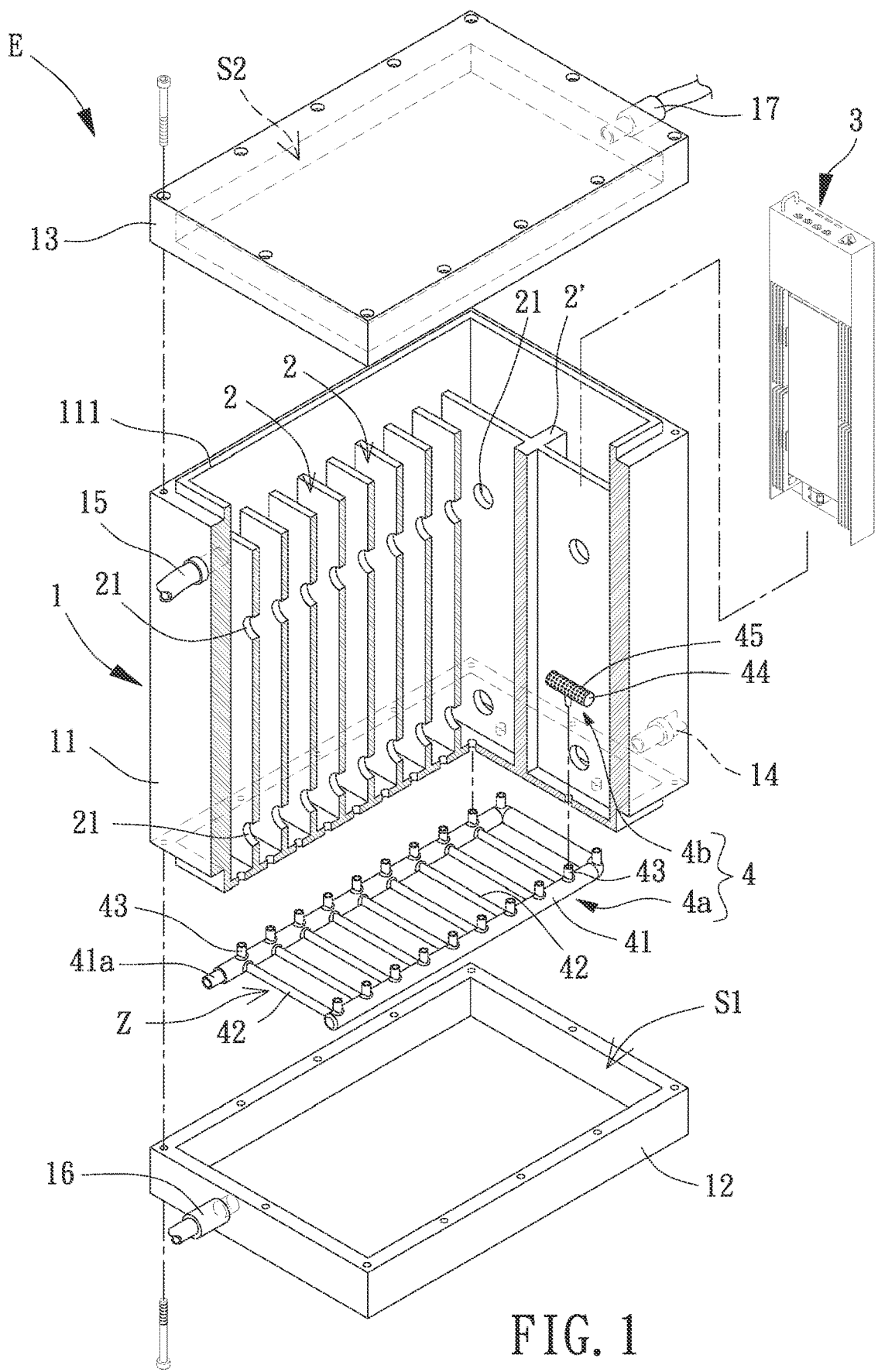
FIG. 1 is an exploded, partly-cutaway, perspective view of an electronic equipment with an immersion cooling system of a first embodiment according to the present invention.

When the terms "front", "rear", "left", "right", "up", "down", "top", "bottom", "inner", "outer", "side", and similar terms are used herein, it should be understood that these terms have reference only to the structure shown in the drawings as it would appear to a person viewing the drawings and are utilized only to facilitate describing the invention, rather than restricting the invention.

DETAILED DESCRIPTION OF THE INVENTION

With reference to FIG. 1, an electronic equipment E with an immersion cooling system of a first embodiment according to the present invention comprises a sealed tank 1, a plurality of slots 2, at least one electric unit 3, and an air supply unit 4. The plurality of slots 2, the electric unit 3, and the air supply unit 4 are disposed in the sealed tank 1.

Figure 4:
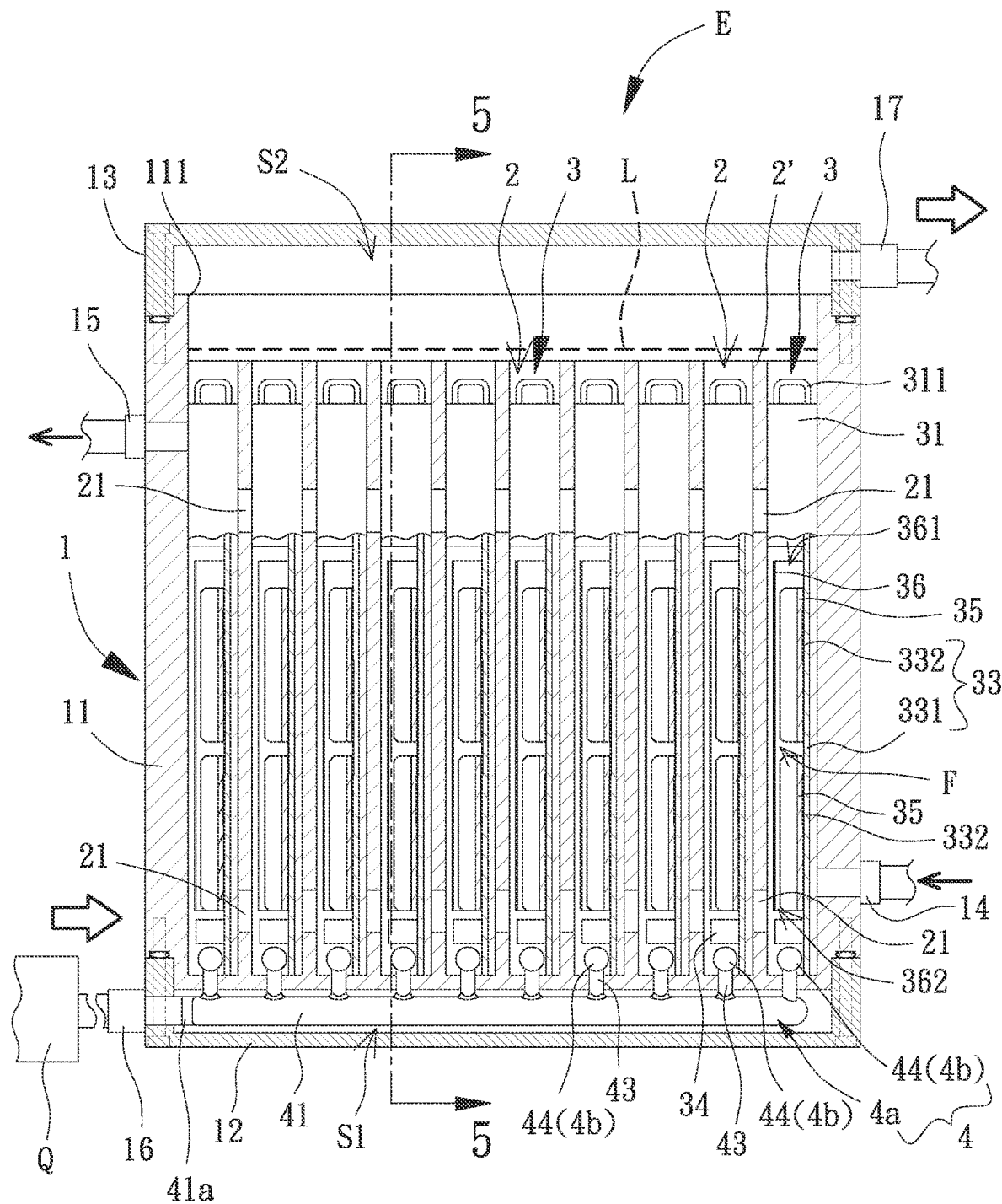
FIG. 4 is a cross sectional view taken along section line 4-4 of FIG. 3.

With reference to FIGS. 1 and 4, the sealed tank 1 is filled with an electrically non-conductive liquid L which is a single-phase electrically non-conductive liquid, such as an electrical engineering liquid with a good flowability but without electrical conductivity. The present invention is not limited to the type of the sealed tank 1. For example, the sealed tank 1 may include a tank body 11. The electrically non-conductive liquid L may be received in the tank body 11. An opening 111 may be formed on the top end of the tank body 11. The sealed tank 1 may include a base 12 which may form an air inlet space S1 therein. The base 12 may be airtightly coupled to a bottom of the tank body 11. The sealed tank 1 may further include a lid 13 in which an air discharge space S2 may be formed. The air discharge space S2 may intercommunicate with an interior of the tank body 11. The lid 13 may be airtightly coupled to the tank body 11 and covers the opening 111, avoiding the electrically conductive liquid L in the tank body 11 from leaking to the outside.

Figure 3:
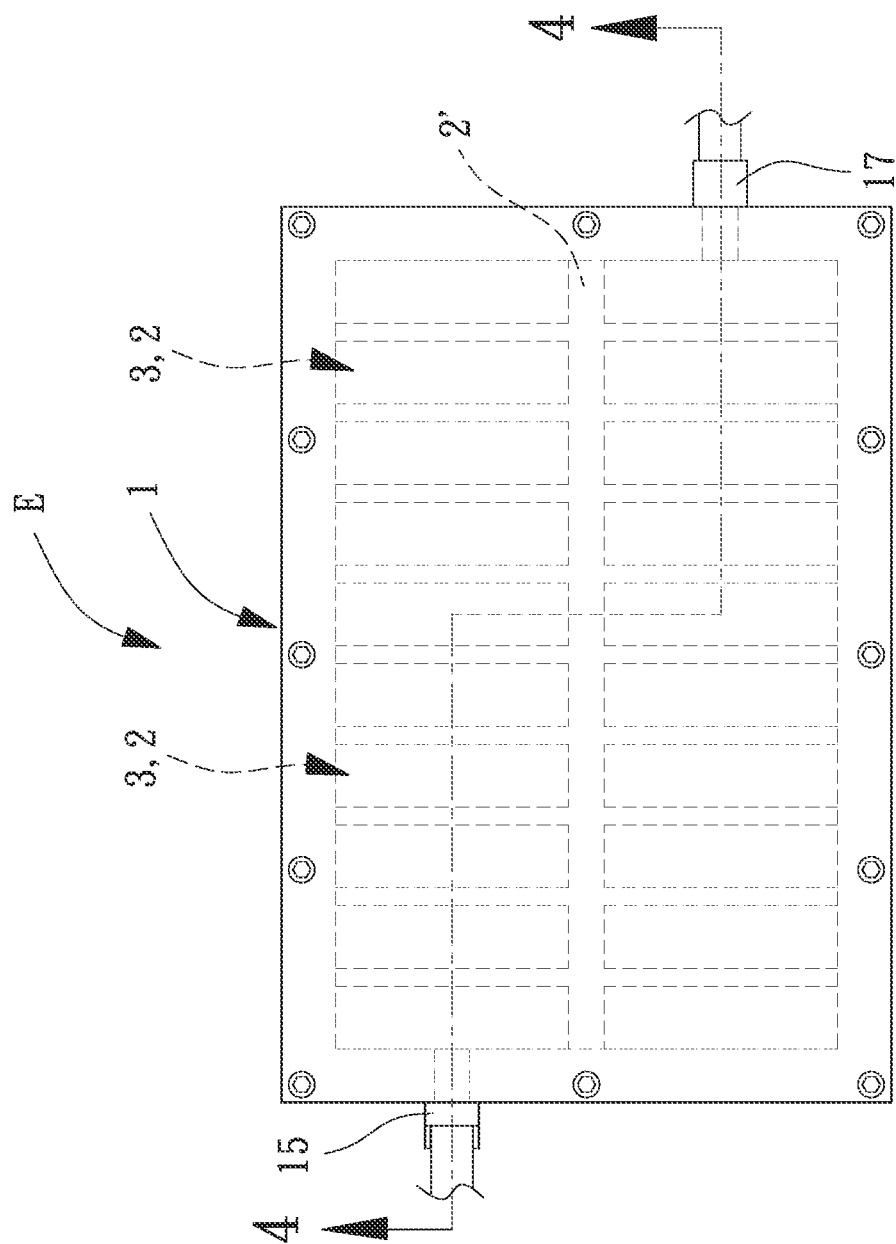
FIG. 3 is a top view of the electronic equipment with an immersion cooling system of the first embodiment according to the present invention after assembly.

With reference to FIGS. 1 and 3, the sealed tank 1 may further include a liquid inlet 14 and a liquid outlet 15. The liquid inlet 14 and the liquid outlet 15 respectively intercommunicate with the interior of the sealed tank 1 for guiding the electrically non-conductive liquid L to flow into and out of the sealed tank 1. The liquid inlet 14 and the liquid outlet 15 may be disposed on the tank body 11 and, more specifically, be selectively disposed on the same side or different sides of the tank body 11 according to the need of the piping layout. Preferably, the liquid inlet 14 may be disposed in a position closer to the bottom end of the tank body 11, whereas the liquid outlet 15 may be disposed in a position closer to the top end of the tank body 11.

Figure 6:
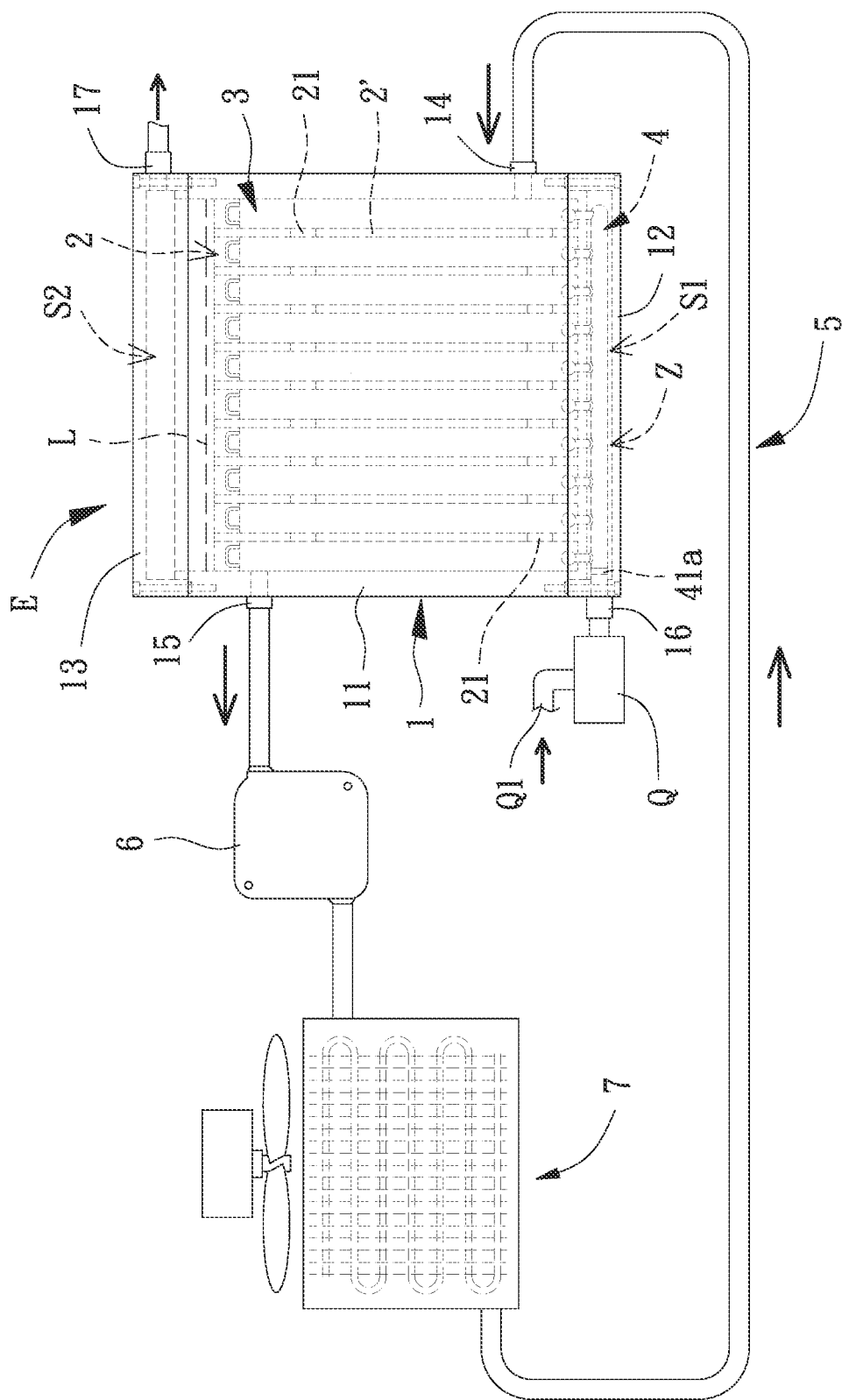
FIG. 6 is a schematic top view illustrating serial connection of a pipe unit, a liquid pump, a cooling unit, and the electronic equipment with an immersion cooling system of the first embodiment according to the present invention.

With reference to FIGS. 1 and 6, the sealed tank 1 may further include an air inlet 16 and an air outlet 17. The air inlet 16 may be disposed on the base 12 and may intercommunicate with an air pump Q. The air pump Q may be located outside the sealed tank 1 and may be configured to permit air to flow in a direction towards the air inlet space S1. The air outlet 17 may be disposed on the lid 13 and may be configured to permit the air to flow in a direction away from the air discharge space S2. The air inlet 16 and the air outlet 17 may be selectively disposed on the same side or different sides of the sealed tank 1 according to the need of the piping disposition. In this embodiment, the air inlet 16 and the air outlet 17 are disposed on different sides of the sealed tank 1.

With reference to FIGS. 1 and 4, the plurality of slots 2 is disposed in the sealed tank 1 and may permit insertion and positioning of the electric unit 3. Thus, when the lid 13 is opened, any electric unit 3 can be removed from the respective slot 2 and removed out of the sealed tank 1 via the opening 111. The type of the plurality of slots 2 may be adjusted by one having ordinary skill in the art according to the type of the sealed tank 1, considering factors such as the quantity of the electric units 3 to be positioned. Therefore, the type of the plurality of slots 2 should not be limited to the form shown in the drawings. In this embodiment, the plurality of slots 2 is formed by a positioning shelf 2'. The positioning shelf 2' may include a plurality of through holes 21 intercommunicating with the liquid inlet 14 and with the liquid outlet 15, such that the electrically non-conductive liquid L flowing into the tank body 11 can flow through the plurality of through holes 21 and can flow outside the tank body 11 via the liquid outlet 15.

Figure 2:
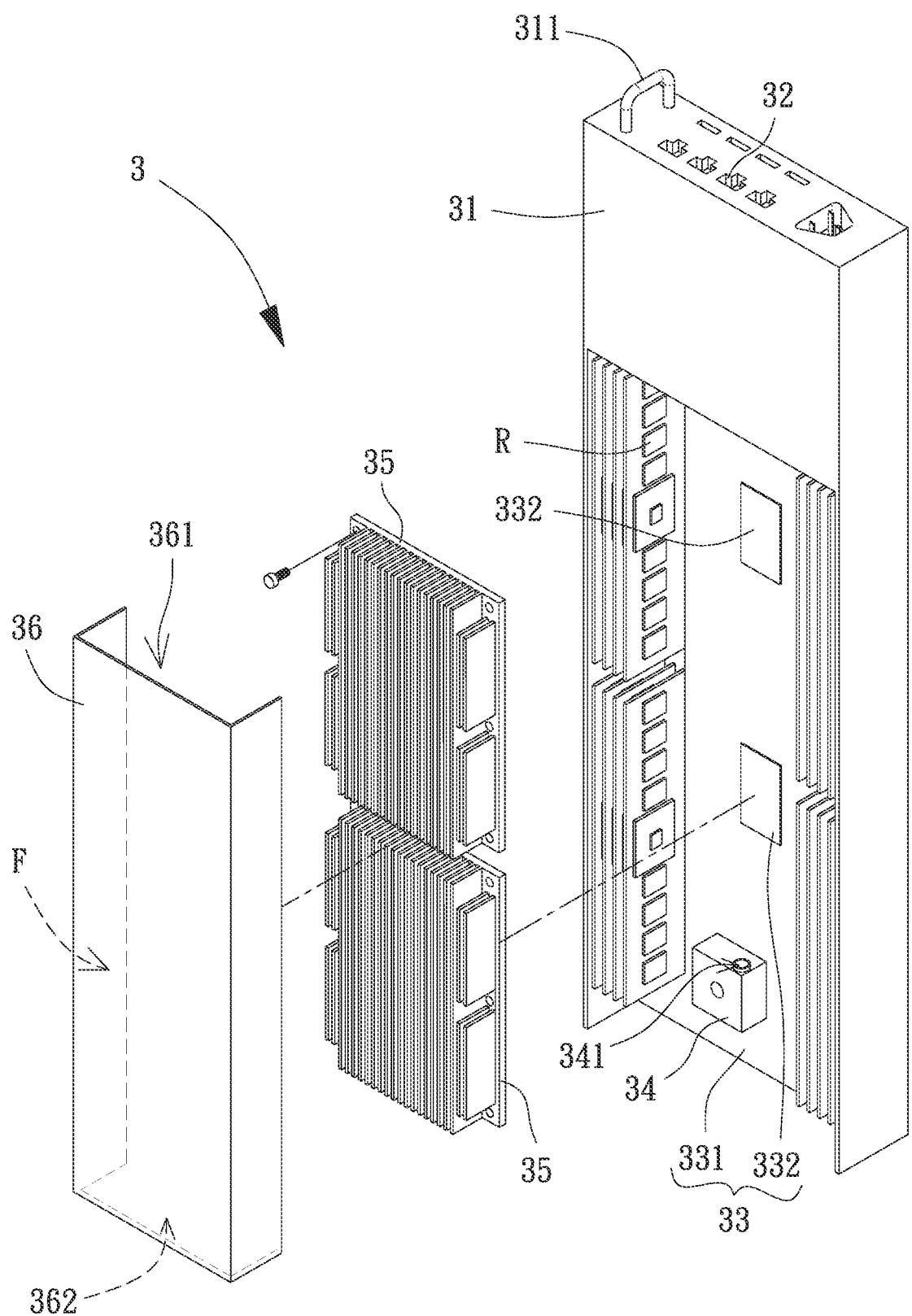
FIG. 2 is an exploded, perspective view of an electric unit of the electronic equipment with an immersion cooling system of the first embodiment according to the present invention.

With reference to FIGS. 2 and 3, the at least one electric unit 3 may be a server unit, a network communication mainframe, or a network communication relay station. The present invention is not limited in this regard. Plural electric units 3 may be used in this embodiment. Each electric unit 3 may include a casing 31 which may be removably inserted into one of the plurality of slots 2. In an embodiment without the casing 31, each electric unit 3 may be inserted into the slot 2 by another portion of the electric unit 3. Furthermore, the type of the casing 31 is not limited in the present invention. For example, the casing 31 may be a rectangular cuboid, and the bottom end of the casing 31 may be open. Each electric unit 3 may further include an electrical connection portion 32 which may be located on the top end of the casing 31. The electrical connection portion 32 may, for example, include a plurality of connection ports, of which the type is not limited. The top end of the casing 31 may further include a hook 311, such that a user can hold the hook 311 and apply a force to remove the casing 31 out of the associated slot 2.

With reference to FIGS. 2 and 4, each electric unit 3 may further include an electric module 33 and at least one fluid driving member 34. The electric module 33 and the at least one fluid driving member 34 may be disposed on the casing 31 so as to be inserted into or removed out of the slot 2 together with the casing 31. Specifically, the electric module 33 may include a substrate 331, such as a printed circuit board (PCB) and, more particularly, a motherboard. The substrate 331 includes at least one heat source 332, such as a CPU, and may include memory(ies) R, graphics card(s), solid state drive(s), etc. When the electric unit 3 is positioned in the slot 2, the heat source 332 can be immersed in the electrically non-conductive liquid L, and the positioning shelf 2' can keep two adjacent casings 31 properly spaced to permit the electrically non-conductive liquid L to flow between the two adjacent casings 31.

The fluid driving member 34 may be disposed on the casing 31 or the substrate 331 and may be immersed in the electrically non-conductive liquid L, thereby guiding the electrically non-conductive liquid L to smoothly flow through the heat source 332. In an example, the fluid driving member 34 may be a pump or an impeller. However, the present invention is not limited in this regard. In this embodiment, the fluid driving member 34 is in the form of a pump. The fluid driving member 34 may be selectively disposed on an upper portion or a lower portion or any other position of the heat source 332. Preferably, the fluid driving member 34 is disposed in a position closer to the bottom end of the electric module 33, namely below the heat source 332, to permit easy suction and driving of the electrically non-conductive liquid L at a relatively lower temperature to flow through the heat source 332, thereby increasing the cooling efficiency.

Furthermore, each electric unit 3 of this embodiment may further include at least one auxiliary cooling member 35 and a fluid passage hood 36. The auxiliary cooling member 35 may be, for example, a fin member and may be in thermal connection with the heat source 332. The fluid passage hood 36 may be configured to restrict the flow area of the electrically non-conductive liquid L, such that the electrically non-conductive liquid L can be driven by the fluid driving member 34 to more concentratively flow through the auxiliary cooling member 35 and the heat source 332. The fluid passage hood 36 may be coupled to the casing 31 or the substrate 331, such that the auxiliary cooling member 35 and the heat source 332 are located inside the fluid passage hood 36. Two ends of the fluid passage hood 36 are open to form a top opening 361 and a bottom opening 362, respectively. A fluid passage F extending substantially along a direction from the base 12 to the lid 13 of the sealed tank 1 is formed in the fluid passage hood 36. The discharge direction of the fluid driving member 34 may face the lid 13 of the sealed tank 1. Preferably, the discharge direction of the fluid driving member 34 is substantially parallel to the fluid passage F.

For example, the fluid driving member 34 may be selectively located inside or outside the fluid passage hood 36, and a discharge port 341 of the fluid driving member 34 faces the top opening 361 of the fluid passage hood 36, such that the electrically non-conductive liquid L is driven upwards. Preferably, the discharge port 341 of the fluid driving member 34 is adjacent to the bottom opening 362 of the fluid passage hood 36, such that the electrically non-conductive liquid L flowing out of the discharge port 341 of the fluid driving member 34 can directly be guided into the fluid passage F and flow upwards through the auxiliary cooling member 35 and the heat source 332. In another embodiment, the electric unit 3 including the auxiliary cooling member 35 may be without the fluid passage hood 36. Alternatively, the electric unit 3 including the fluid passage hood 36 may be without the auxiliary cooling member 35. Thus, the present invention is not limited to the type of this embodiment illustrated in the figures.

With reference to FIG. 1, the air supply unit 4 includes a ventilation tube unit 4a which may be located in the air inlet space S 1. The ventilation tube unit 4a may include a main tube 41 which may be bent to form a hollow area Z. In this embodiment, the main tube 41 may be U-shaped. The main tube 41 may include an intercommunicating portion 41a intercommunicating with the air inlet 16, such that the air can enter the main tube 41 via the air inlet 16. Preferably, the ventilation tube unit 4a may include a plurality of branch tubes 42 which may be located in the hollow area Z. The plurality of branch tubes 42 may intercommunicate with the main tube 41 and may be aligned with the plurality of slots 2.

Figure 5:
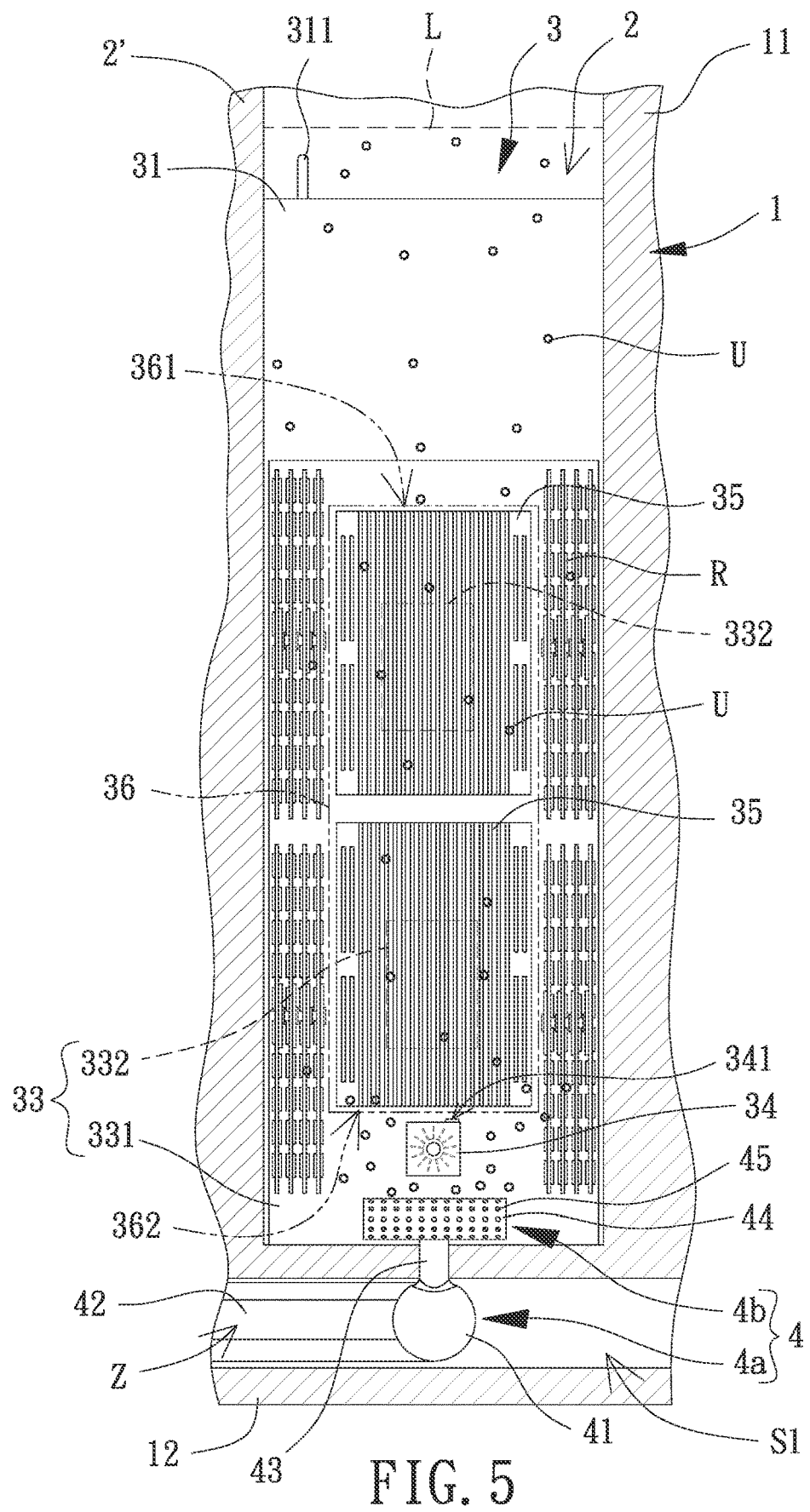
FIG. 5 is a cross sectional view taken alone section line 5-5 of FIG. 4.

With reference to FIGS. 1 and 5, the ventilation tube unit 4a may include a plurality of air inlet tubes 43 intercommunicating with the main tube 41. The plurality of air inlet tubes 43 may be located on two sides of the plurality of branch tubes 42. Namely, each of two sides of each branch tube 42 has an air inlet tube 43 disposed thereon. The plurality of air inlet tubes 43 may be aligned with the plurality of slots 2. The openings of the plurality of air inlet tubes 43 may face the lid 13. Furthermore, the plurality of air inlet tubes 43 preferably extend into the plurality of slots 2. Moreover, the air supply unit 4 may include a plurality of air diffusers 4b coupled with the plurality of air inlet tubes 43 of the ventilation tube unit 4a. The plurality of air diffusers 4b is immersed in the electrically non-conductive liquid L. The fluid driving member 34 may be located between the heat source 332 and the air diffuser 4b. The plurality of air diffusers 4b may be, for example, bubble stones. The structural type of the plurality of air diffusers 4b is not limited in the present invention as long as the plurality of air diffusers 4b can permit the air to more efficiently dissolve into the electrically non-conductive liquid L. In this embodiment, each air diffuser 4b may include a diffuser body 44 connected to the air inlet tube 43. Each air diffuser 4b may include a plurality of through holes 45 extending through the diffuser body 44. The air can dissolve into the electrically non-conductive liquid L via the plurality of through holes 45.

Figure 7:
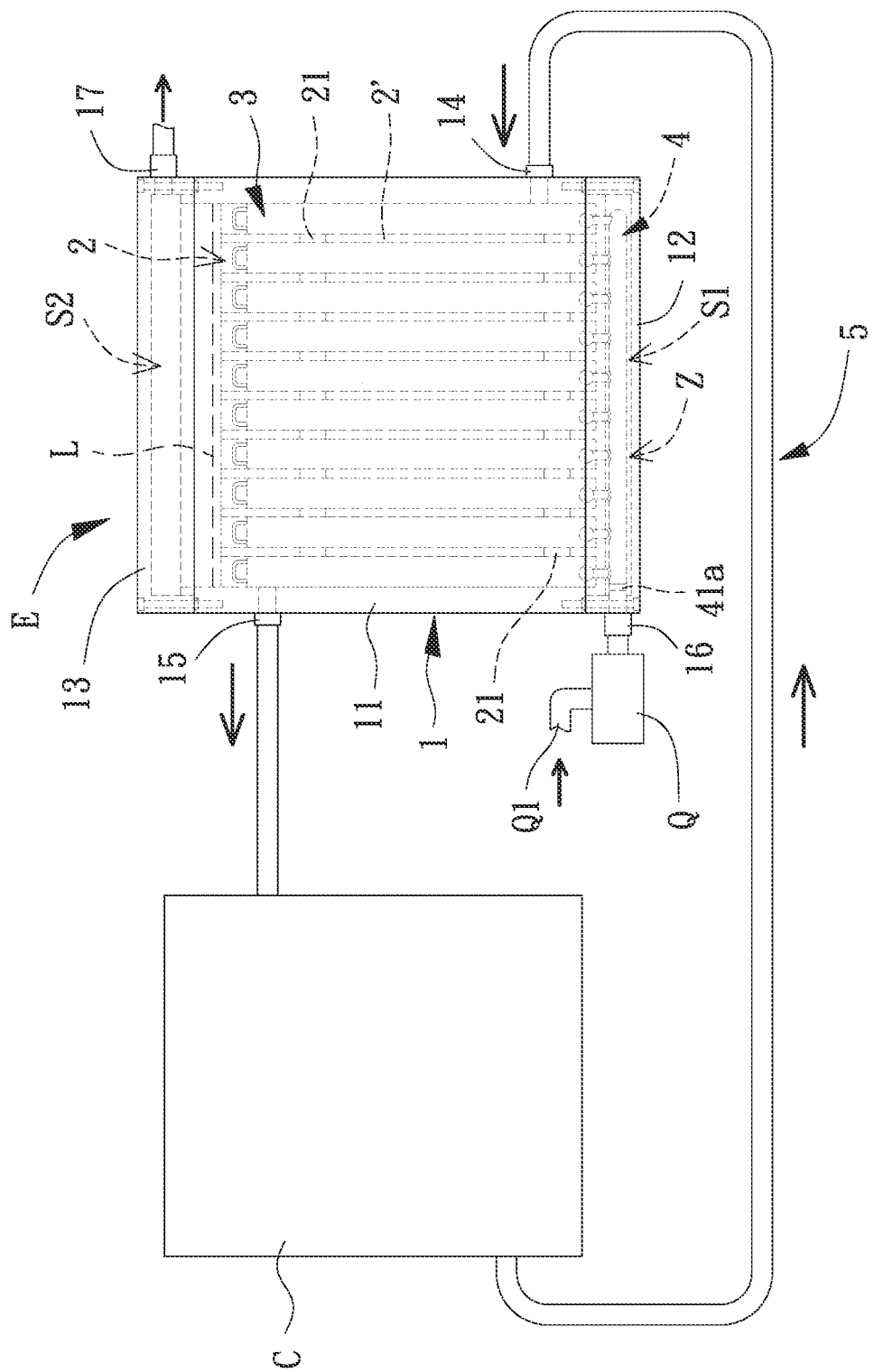
FIG. 7 is a schematic top view illustrating serial connection of a cooling distribution unit and the electronic equipment with an immersion cooling system of the first embodiment according to the present invention.

With reference to FIGS. 4 and 6, in use of the electronic equipment E with an immersion cooling system of this embodiment, an end of a pipe unit 5 is connected to the liquid inlet 14 of the sealed tank 1, and another end of the pipe unit 5 is connected with the liquid outlet 15 of the sealed tank 1. A liquid pump 6 and a cooling unit 7 are connected in series with the pipe unit 5, such that the electronic equipment E with an immersion cooling system, the liquid pump 6, and the cooling unit 7 can form a circulation loop. In another embodiment, as shown in FIG. 7, a cooling distribution unit (CDU) C may be used to replace the liquid pump 6 and the cooling unit 7. Namely, an end of a pipe unit 5 is connected to the liquid inlet 14 of the sealed tank 1, and another end of the pipe unit 5 is connected to the liquid outlet 15 of the sealed tank 1. The cooling distribution unit (CDU) C is connected in series with the pipe unit 5, such that the electronic equipment E with an immersion cooling system and the cooling distribution unit C can form a circulation loop.

With reference to FIGS. 5 and 6, accordingly, the liquid pump 6 can drive the electrically non-conductive liquid L to flow in the pipe unit 5. The electrically non-conductive liquid L at a relatively lower temperature can flow into the tank body 11 of the sealed tank 1 via the liquid inlet 14. Furthermore, the air pump Q supplies the air to flow into the air inlet space S1 of the sealed tank 1. The air flows through each air diffuser 4b to form bubbles U which flow upwards and disperse in the electrically non-conductive liquid L. Thus, the bubbles stir the electrically non-conductive liquid L, which causes upward flow and rapid dispersion of the electrically non-conductive liquid L at a relatively lower temperature, thereby flowing through the heat source 332 of the electric module 33 of each electric unit 3. At this time, the electrically non-conductive liquid L absorbs the heat energy from the heat source 332 and its temperature rises, and the electric module 33 can be maintained at a proper working temperature.

During the upward flow, the electrically non-conductive liquid L will undergo heat exchange with ambient electrically non-conductive liquid L at a relatively lower temperature. In comparison with the electrically non-conductive liquid L at a lower position, the electrically non-conductive liquid L at an upper position has a higher temperature and can flow out of the liquid outlet 15 of the sealed tank 1 into the pipe unit 5, and then flow through the cooling unit 7 under the guidance of the pipe unit 5. The temperature of the electrically non-conductive liquid L is further lowered when passing through the cooling unit 7, such that electrically non-conductive liquid L at a relatively lower temperature can pass through the liquid inlet 14 to flow into the sealed tank 1 again. This cycle repeats to maintain the electric modules 33 of the plural electric unit 3 of the electronic equipment E with an immersion cooling system at a proper working temperature, thereby effectively avoiding problems including being overheated, etc. Furthermore, the bubbles U formed by the air can flow upward into the air discharge space S2 and be discharged from the sealed tank 1 via the air outlet 17. On the other hand, fresh air can flow into the air inlet 16 via an inlet pipe Q1 of the air pump Q to enter the air inlet space S1 again, forming an air circulation loop.

Furthermore, through disposition of the fluid driving member 34, it is assured that the bubbles U formed by each air diffuser 4b can flow first through the fluid driving member 34 and then to the heat source 332, such that the bubbles U can more easily disperse in the electrically non-conductive liquid L. More specifically, the electronic equipment E with an immersion cooling system according to the present invention may include both of the plurality of air diffusers 4b and the fluid driving member 34 or only one of the plurality of air inlet tubes 43 and the fluid driving member 34. In this embodiment, the electronic equipment E with an immersion cooling system includes both of the plurality of air diffusers 4b and the fluid driving member 34.

Figure 8:
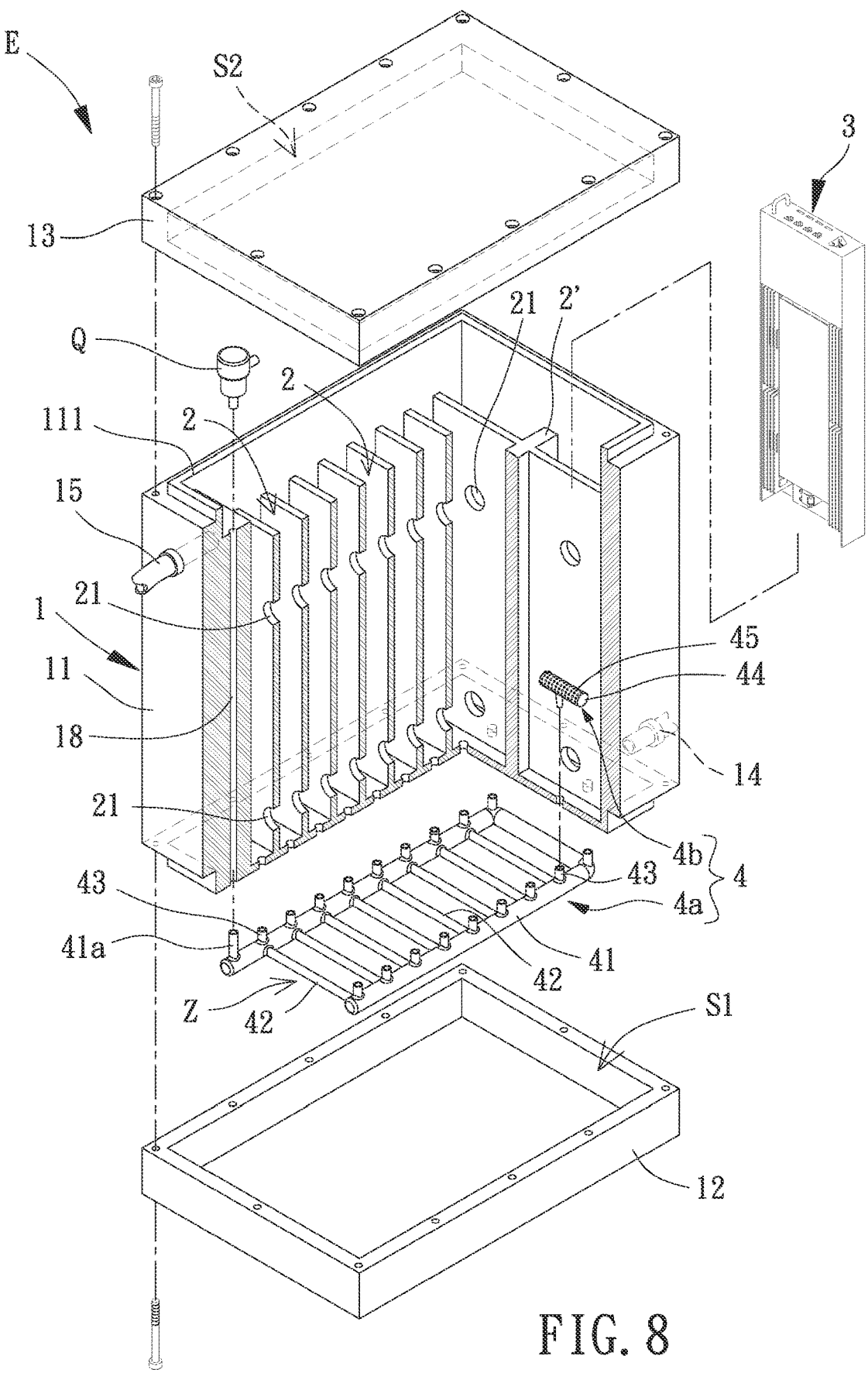
FIG. 8 is an exploded, partly-cutaway, perspective view of an electronic equipment with an immersion cooling system of a second embodiment according to the present invention.
Figure 9:
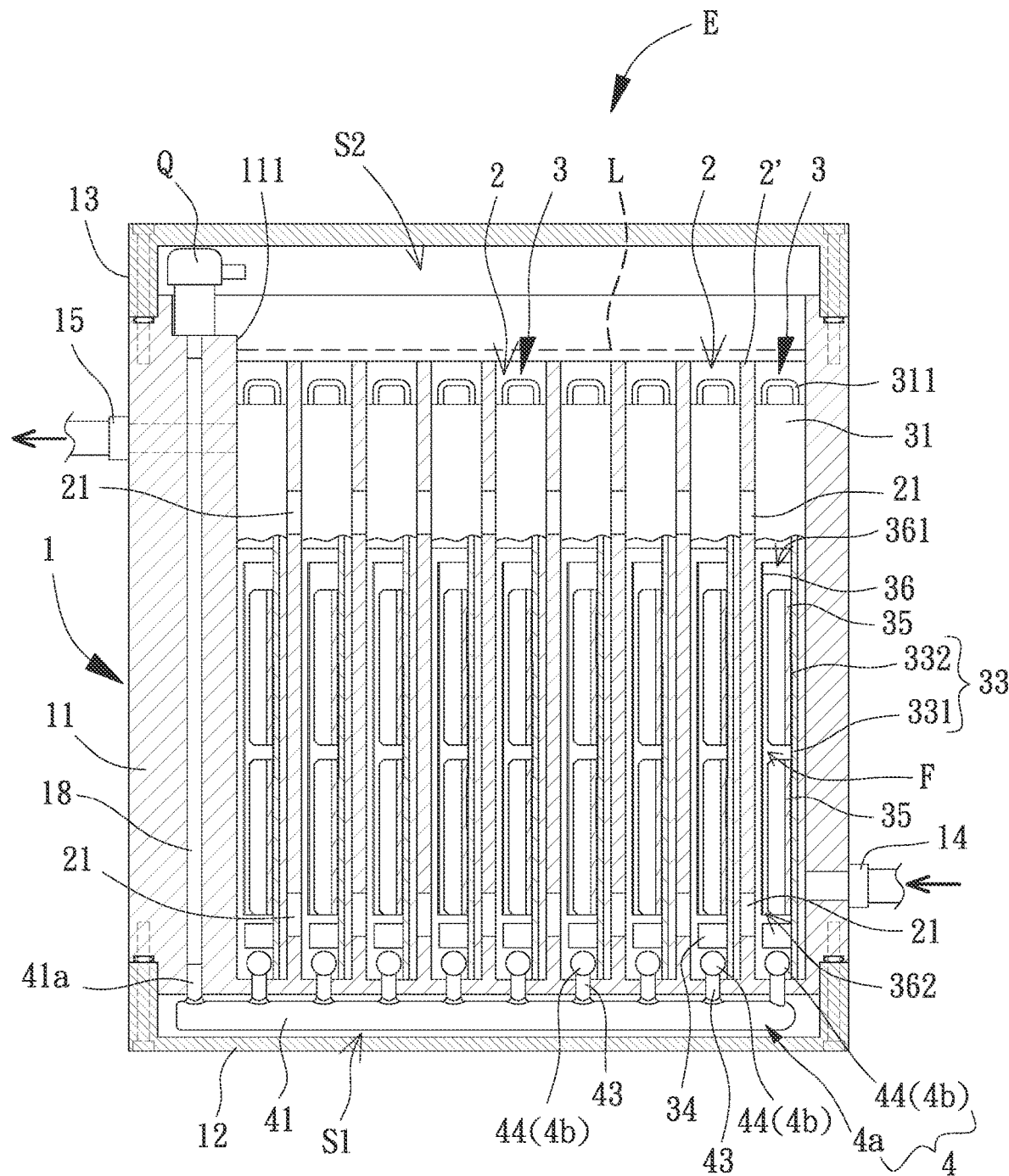
FIG. 9 is a cross sectional view of the electronic equipment with an immersion cooling system of the second embodiment according to the present invention.

With reference to FIGS. 8 and 9 showing an electronic equipment E with an immersion cooling system of a second embodiment according to the present invention, the second embodiment is substantially the same as the first embodiment. In the second embodiment, the air pump Q may be located inside the sealed stank 1. The air pump Q may be coupled to the tank body 11 and received in the air discharge space S2. The tank body 11 may include a channel 18 intercommunicating the air inlet space S1 with the air outlet space S2. An end of the channel 18 may be connected with the air pump Q. Another end of the channel 18 may be connected with the intercommunicating portion 41a of the main tube 41. The air supplied by the air pump Q can enter the main tube 41 via the channel 18. The air passes through each air diffuser 4b to form bubbles U which flow upwards (as shown in FIG. 5) and disperse in the electrically non-conductive liquid L. Thus, the bubbles U stir the electrically non-conductive liquid L to cause upward flow and rapid dispersion of the electrically non-conductive liquid L at a relatively lower temperature, thereby driving the electrically non-conductive liquid L at the relatively lower temperature to flow through the heat source 332 of the electric module 33 of each electric unit 3. At this time, the electrically non-conductive liquid L absorbs the heat energy from the heat source 332 and its temperature rises, thereby maintaining the electric module 33 at a proper working temperature. Therefore, through providing the air pump Q inside the sealed tank 1, interference from other elements can be easily avoided while installing the electronic equipment E with an immersion cooling system, providing easy installation.

In summary, in the electronic equipment with an immersion cooling system according to the present invention, the air supply unit is disposed in the sealed tank, and the air supplied by the air supply unit can form upwardly flowing bubbles which disperse in the electrically non-conductive liquid. The upwardly flowing bubbles can cause flow and rapid dispersion of the electrically non-conductive liquid at a relatively lower temperature to thereby flow through the heat source of the electric module of the electric unit. Therefore, the heat distribution of the electrically non-conductive liquid is more uniform, such that the electrically non-conductive liquid can effectively cool the heat source. Accordingly, a good cooling efficiency can be achieved.

Although the present invention has been described with respect to the above preferred embodiments, these embodiments are not intended to restrict the present invention. Various changes and modifications on the above embodiments made by any person skilled in the art without departing from the spirit and scope of the present invention are still within the technical category protected by the present invention. Accordingly, the scope of the present invention shall include the literal meaning set forth in the appended claims and all changes which come within the range of equivalency of the claims. Furthermore, in a case that several of the above embodiments can be combined, the present invention includes the implementation of any combination.

What is claimed is:

1. An electronic equipment with an immersion cooling system, comprising:
   a sealed tank filled with an electrically non-conductive liquid which is a single-phase electrically non-conductive liquid;
   a plurality of slots disposed in the sealed tank;
   at least one electric unit removably inserted in the plurality of slots and including at least one heat source and at least one fluid driving member; and
   an air supply unit disposed in the sealed tank, wherein the air supply unit includes a ventilation tube unit and a plurality of air diffuser,
   wherein the plurality of air diffusers is coupled with the ventilation tube unit, is immersed in the electrically non-conductive liquid, and is configured to generate bubbles for stirring the electrically non-conductive liquid;
   wherein the at least one fluid driving member is located between the at least one heat source and the plurality of air diffusers of the air supply unit; and
   wherein the ventilation tube unit includes a main tube, a plurality of branch tubes and a plurality of air inlet tubes, wherein the plurality of air inlet tubes extend vertically from the main tube into the plurality of slots.

2. The electronic equipment with the immersion cooling system as claimed in claim 1, wherein the plurality of branch tubes intercommunicates with the main tube and is aligned with the plurality of slots.

3. The electronic equipment with the immersion cooling system as claimed in claim 2, wherein the plurality of air diffusers is coupled with the plurality of air inlet tubes.

4. The electronic equipment with the immersion cooling system as claimed in claim 3, wherein each of the plurality of air diffusers includes a diffuser body and a plurality of through holes, wherein the diffuser body intercommunicates with the plurality of air inlet tubes, and wherein the plurality of through holes extends through the diffuser body.

5. The electronic equipment with the immersion cooling system as claimed in claim 1, wherein the sealed tank includes a tank body, wherein the electrically non-conductive liquid is received in the tank body, wherein an opening is formed on a top end of the tank body, wherein the sealed tank includes a base and a lid, wherein the base is coupled to a bottom of the tank body, and wherein the lid is coupled to the tank body and covers the opening.

6. The electronic equipment with the immersion cooling system as claimed in claim 5, wherein the sealed tank includes an air inlet and an air outlet, wherein the air inlet is disposed on the base, and wherein the air outlet is disposed on the lid.

7. The electronic equipment with the immersion cooling system as claimed in claim 6, further comprising an air pump disposed outside the sealed tank and intercommunicating with the air inlet.

8. The electronic equipment with the immersion cooling system as claimed in claim 5, further comprising an air pump disposed inside the sealed tank, wherein the tank body includes a channel having an end intercommunicating with the air pump and another end intercommunicating with the main tube of the air supply unit.

9. The electronic equipment with the immersion cooling system as claimed in claim 1, wherein the electric unit includes a casing removably inserted in one of the plurality of slots, wherein the electric unit includes an electric module which is disposed in the casing and includes the at least one heat source.

10. The electronic equipment with the immersion cooling system as claimed in claim 9, wherein the electric unit includes a substrate, wherein the at least one heat source is disposed on the substrate, and wherein the electric unit includes the fluid driving member disposed in the casing or on the substrate.

11. The electronic equipment with the immersion cooling system as claimed in claim 10, wherein the electric unit includes a fluid passage hood coupled to the casing or the substrate, wherein the casing includes a bottom end being open, and wherein the at least one heat source is located inside the fluid passage hood.

12. The electronic equipment with the immersion cooling system as claimed in claim 11, wherein the electric unit includes at least one auxiliary cooling member in thermal connection with the at least one heat source and located inside the fluid passage hood.

13. The electronic equipment with the immersion cooling system as claimed in claim 11, wherein a fluid passage is formed in the fluid passage hood, and wherein a discharge direction of the fluid driving member faces a lid of the sealed tank.

14. The electronic equipment with the immersion cooling system as claimed in claim 13, wherein two ends of the fluid passage hood are open to form a top opening and a bottom opening, and wherein a discharge port of the fluid driving member is adjacent to the bottom opening.

15. The electronic equipment with the immersion cooling system as claimed in claim 9, wherein the casing includes a top end having a hook.

16. The electronic equipment with the immersion cooling system as claimed in claim 1, further comprising a pipe unit, wherein an end of the pipe unit is connected to a liquid inlet of the sealed tank, wherein another end of the pipe unit is connected to a liquid outlet of the sealed tank, and wherein a liquid pump and a cooling unit are serially connected between the end and the another end of the pipe unit.

17. The electronic equipment with the immersion cooling system as claimed in claim 1, further comprising a pipe unit, wherein an end of the pipe unit is connected to a liquid inlet of the sealed tank, wherein another end of the pipe unit is connected to a liquid outlet of the sealed tank, and wherein a cooling distribution unit is serially connected between the end and the another end of the pipe unit.

18. The electronic equipment with the immersion cooling system as claimed in claim 1, wherein the plurality of air diffusers includes bubble stones.

* * * * *